United States Patent
Sassiat et al.

(10) Patent No.: US 8,951,877 B2
(45) Date of Patent: Feb. 10, 2015

(54) TRANSISTOR WITH EMBEDDED STRAIN-INDUCING MATERIAL FORMED IN CAVITIES BASED ON AN AMORPHIZATION PROCESS AND A HEAT TREATMENT

(71) Applicant: GLOBALFOUNDRIES Inc., Grand Cayman (KY)

(72) Inventors: Nicolas Sassiat, Dresden (DE); Carsten Grass, Dresden (DE); Jan Hoentschel, Dresden (DE); Ran Yan, Dresden (DE); Ralf Richter, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 38 days.

(21) Appl. No.: 13/799,741

(22) Filed: Mar. 13, 2013

(65) Prior Publication Data
US 2014/0264347 A1    Sep. 18, 2014

(51) Int. Cl.
*H01L 21/336* (2006.01)
*H01L 29/786* (2006.01)
*H01L 29/66* (2006.01)

(52) U.S. Cl.
CPC ...... *H01L 29/78642* (2013.01); *H01L 29/6675* (2013.01)

USPC .............................................. 438/303

(58) Field of Classification Search
None
See application file for complete search history.

(56) References Cited

U.S. PATENT DOCUMENTS

| 7,586,153 | B2 * | 9/2009 | Hoentschel et al. | 257/344 |
| 7,763,505 | B2 * | 7/2010 | Gehring et al. | 438/187 |
| 2009/0280627 | A1 * | 11/2009 | Pal et al. | 438/504 |
| 2010/0078689 | A1 * | 4/2010 | Kronholz et al. | 257/288 |

* cited by examiner

*Primary Examiner* — Wensing Kuo
*Assistant Examiner* — Herve Assouman
(74) *Attorney, Agent, or Firm* — Amerson Law Firm, PLLC (57) ABSTRACT

When forming cavities in active regions of semiconductor devices in order to incorporate a strain-inducing semiconductor material, an improved shape of the cavities may be achieved by using an amorphization process and a heat treatment so as to selectively modify the etch behavior of exposed portions of the active regions and to adjust the shape of the amorphous regions. In this manner, the basic configuration of the cavities may be adjusted with a high degree of flexibility. Consequently, the efficiency of the strain-inducing technique may be improved.

14 Claims, 7 Drawing Sheets

TRANSISTOR WITH EMBEDDED STRAIN-INDUCING MATERIAL FORMED IN CAVITIES BASED ON AN AMORPHIZATION PROCESS AND A HEAT TREATMENT

BACKGROUND OF THE INVENTION

1. Field of the Invention

Generally, the present disclosure relates to the fabrication of integrated circuits, and, more particularly, to transistors having strained channel regions by using embedded strain-inducing semiconductor material so as to enhance charge carrier mobility in the channel regions of the transistors.

2. Description of the Related Art

The fabrication of complex integrated circuits requires the provision of a large number of transistor elements, which represent the dominant circuit element for complex circuits. For example, several hundred millions of transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions so as to provide low sheet and contact resistivity in combination with desired channel controllability. Moreover, the gate dielectric material may also be adapted to the reduced channel length in order to maintain the required channel controllability. However, some mechanisms for maintaining high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby enabling a performance improvement that is comparable with the advance to a technology standard requiring extremely scaled critical dimensions, while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which in turn may directly translate into a corresponding increase in conductivity. On the other hand, compressive strain in the channel region may increase the mobility of holes, thereby providing the potential for enhancing the performance of P-type transistors. The introduction of stress or strain engineering into integrated circuit fabrication is an extremely promising approach, since strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium (SiGe) material next to the channel region so as to induce a compressive stress that may result in a corresponding strain. When forming the Si/Ge material, the drain and source regions of the PMOS transistors are selectively recessed to form cavities, while the NMOS transistors are masked, and subsequently the silicon/germanium material is selectively formed in the cavities of the PMOS transistor by epitaxial growth.

Although the technique has significant advantages in view of performance gain of P-channel transistors and thus of the entire CMOS device, it turns out, however, that in advanced semiconductor devices including a large number of transistor elements, an increased variability of device performance may be observed, which may be associated with the above-described technique for incorporating a strained silicon/germanium alloy in the drain and source regions of P-channel transistors.

The presence of a strain-inducing silicon/germanium material in the drain and source regions of P-channel transistors may drastically alter the current drive capability of the transistor and, thus, even small variations during the incorporation of the silicon/germanium material or any variations of the material composition may, therefore, significantly affect performance of the P-channel transistor. The strain-inducing effect of the embedded silicon/germanium material depends on the amount of the embedded strain-inducing semiconductor material, the distance with respect to the channel region and also depends on the size and shape of the strain-inducing semiconductor material. For example, incorporating an increased fraction of germanium may result in an increase of the resulting strain, since the corresponding lattice mismatch between the silicon/germanium material and the silicon material of the active region may be increased. The maximum concentration of germanium in the semiconductor alloy, however, may depend on the process strategy used, since further increasing the germanium concentration may result in undue germanium agglomeration, which in turn may provide increased lattice defects and the like. Furthermore, the amount of the strain-inducing material and the shape thereof in the drain and source regions may depend on the size and shape of the cavities formed in the drain and source areas, wherein also the effective distance from the channel region may be substantially determined on the basis of the size and shape of the corresponding cavities. Consequently, for a given deposition recipe of providing the strain-inducing silicon/germanium material, i.e., for a given germanium concentration in the semiconductor material, the size and shape of the cavities may play an important role in adjusting the overall performance of the transistor, wherein, in particular, across-die uniformity and across-substrate uniformity of the resulting performance gain of P-channel transistors may be significantly determined on the basis of the size and shape of the cavities.

A typical conventional process flow for forming an embedded silicon/germanium material in P-channel transistors may include the following process steps. After forming the active semiconductor regions for forming transistors therein and thereabove, which is typically accomplished by forming appropriate isolation regions that laterally delineate the active regions, the gate electrode structures are formed on the basis of any appropriate process strategy. That is, appropriate materials, such as dielectric materials, electrode materials and the like, are provided in combination with one or more appropriate dielectric cap materials, which may be used, in addition to the actual patterning of the gate layer stack, as etch and deposition masks in a later manufacturing stage, when forming the embedded strain-inducing silicon/germanium material. In sophisticated applications, the gate electrode structures of field effect transistors may be provided with a gate length of 50 nm and less, thereby providing basic sophisticated transistor performance, for instance in terms of switching speed and drive current capability. The reduced critical dimensions, however, may also contribute to a pronounced dependency of the resulting transistor performance on process variations, in particular when produced upon implementing a very efficient performance enhancing mechanism, such as embedding the strain-inducing silicon/germanium material in P-channel transistors. For example, a variation of the lateral distance of the silicon/germanium material with respect to the channel region may over-proportionally influence the finally obtained performance, in particular when basically extremely scaled transistors are considered. For example, forming any sidewall spacers on the gate electrode structures for preserving integrity of sensitive materials, such as the gate dielectric material, the electrode material and the like, may significantly influence the lateral distance, wherein all but readily reducing the resulting spacer width may not be compatible with other device requirements, such as integrity of the gate materials. Consequently, in particular for a reduced gate length, even a minute variation of the spacer width may significantly contribute to overall variability of the resulting performance gain obtained by the embedded silicon/germanium material.

Based on the dielectric cap material and the sidewall spacer structures, cavities may then be etched into the drain and source areas, wherein the size and shape may be substantially determined on the basis of the etch parameters of the corresponding etch strategy. It should be appreciated that any other transistors, such as N-channel transistors, in which an incorporated silicon/germanium material is not required, are covered by an appropriate mask layer. It is well known that the etch rate in anisotropic plasma assisted processes may depend on the local neighborhood of a certain device area. In plasma assisted anisotropic etch processes, which may be performed on the basis of hydrogen bromide and the like, through etching silicon material, appropriate organic additives are used in order to adjust the anisotropic nature in combination with appropriately selected plasma conditions of the etch process under consideration. The presence of reactive components, organic additives and even the plasma conditions may, however, slightly vary depending on the local conditions, such as the "density" of circuit elements and the like. That is, the local configuration of the semiconductor device may effect the local etch conditions, for instance in one area a plurality of exposed surface areas to be etched may be present, while in other device areas, a significantly reduced "density" of corresponding surface areas may be present, thereby contributing to a different etch behavior in these areas. For example, upon forming cavities in the silicon-based drain and source regions of transistors, densely packed device areas, i.e., in device areas, in which closely spaced gate electrodes of transistors may be present, where a different etch behavior occurs compared to less densely packed device areas. A corresponding effect is also well known as "pattern loading," which may thus result in a difference in size and/or shape of the resulting cavities, which in turn may, therefore, contribute to very pronounced variability of transistor performance, as is also discussed above.

In some conventional approaches, the variability in size and shape of the resulting cavities is compensated for, at least to a certain degree, by additionally performing a wet chemical etch process that has a high crystallographic anisotropy so that precise control of the lateral offset of the cavities and their size and shape may be accomplished. For example, a crystallographically anisotropic etch process may be accomplished by using well-established etch reagents, such as tetra methyl and ammonium hydroxide (TMAH), potassium hydroxide and the like, wherein the wet chemical etch chemistry has an inherent "anisotropic" etch behavior with respect to different crystallographic orientations of the silicon material to be patterned. Consequently, this inherent difference in etch rate provides a restricted etch behavior in the lateral direction of the cavities for a standard crystallographic configuration of the silicon-based material, thereby obtaining superior process uniformity with respect to the size and shape of the resulting cavities. Typically, a standard crystallographic orientation of a silicon material is used, i.e., a (100) surface orientation with the transistor length directions oriented along a <110> direction, or any physically equivalent direction, wherein a significantly reduced etch rate along <111> directions is observed compared to other crystallographic axes, such as the <110>, <100> axes or any corresponding equivalent directions. It should be appreciated that, in this application, corresponding crystallographic orientations are to be understood as representing physically equivalent orientations, i.e., <100> orientation is to be understood as representing any physically equivalent orientations, such as <010>, <001>, <−100> and the like. The same holds true for crystal planes.

Consequently, upon applying a final crystallographically anisotropic etch step, well-defined sidewall surfaces may be formed in the cavity, for instance according to the crystal geometry, wherein the (111) planes may act as "etch stop" layers so that so called sigma-shaped cavities may be formed.

This approach may provide superior etch conditions and, thus, an improved shape of the resulting cavities. It turns out, however, that a significant variation in cavity depth across semiconductor die regions may be observed, wherein a reduced cavity depth is encountered in device areas comprising closely spaced gate electrode structures, while an increased depth may be found in device areas of less densely packed transistors.

Figure 1A:
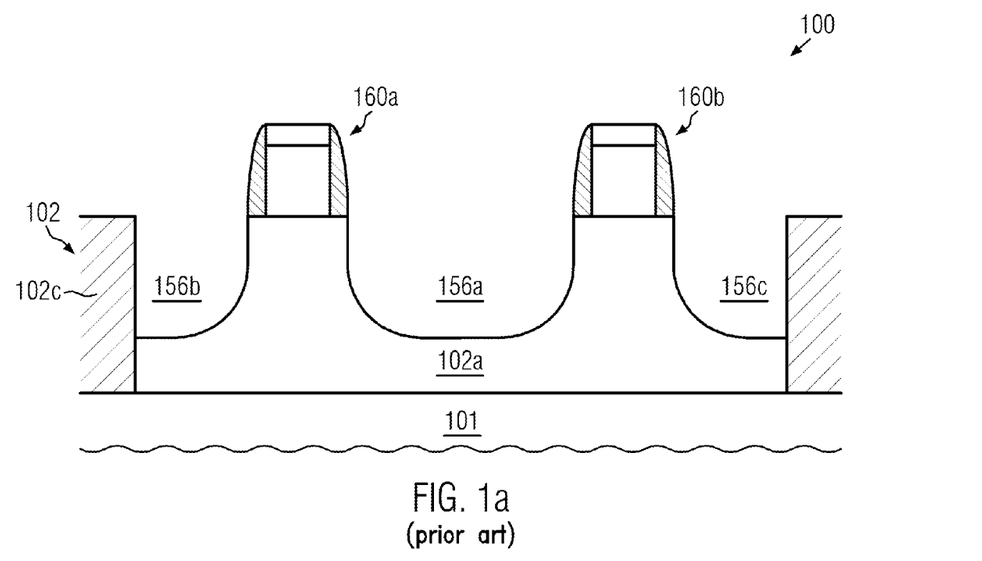
FIGS. 1a and 1b schematically illustrate cross-sectional views of a semiconductor device comprising U-shaped or sigma-shaped cavities formed in the active region, according to a conventional strategy.

U.S. 2011/0294269 A1 discloses manufacturing strategies for incorporating a semiconductor material in cavities provided in the drain and source areas of transistors with a reduced dependency on pattern loading effects, when forming the corresponding cavities. To this end, the material of the semiconductor region to be patterned may be appropriately modified on the basis of a process strategy having a reduced pattern loading effect, such as an ion implantation process resulting in the creation of significant crystal damage and, thus, amorphization of the material, which may, therefore, result in a significantly different etch rate. The amorphous semiconductor material may then be etched on the basis of an isotropic etch process, wherein the amorphous material may provide improved uniformity and controllability of the etch process so that improved uniformity in terms of size and shape of a corresponding cavity may be achieved as depicted in FIG. 1a. FIG. 1a illustrates a semiconductor device 100 comprising gate electrode structures 160a and 160b and U-shaped cavities 156a, 156b, 156c formed in the active region 102a of the semiconductor layer 102 formed above a substrate 101. The active region 102a is delineated by an isolation region 102c.

Figure 1B:
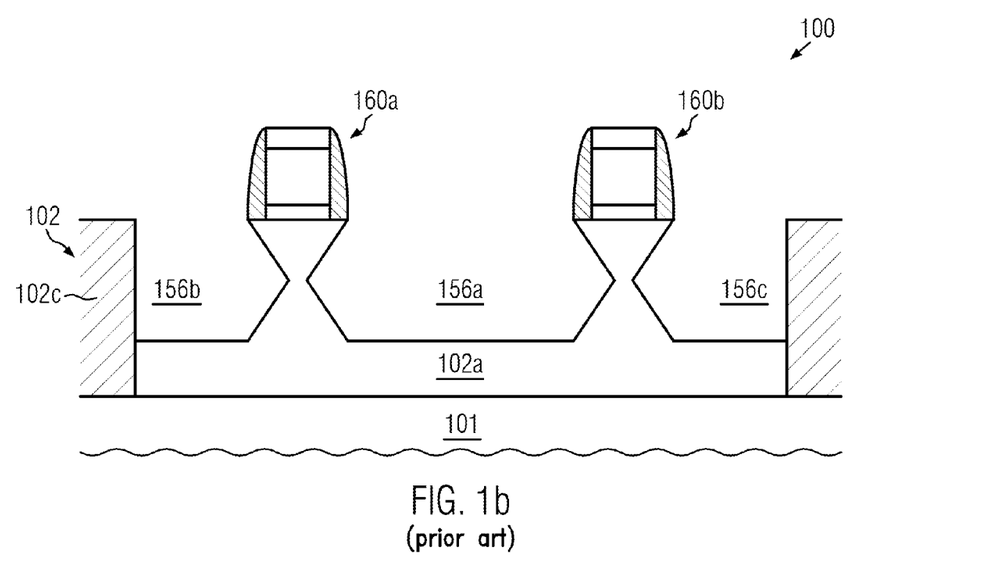

A further improved shape may be obtained by performing an additional crystallographically anisotropic etch process, for instance for obtaining well-defined sidewall surface areas connecting to the channel region of the transistors under consideration as depicted in FIG. 1b. FIG. 1b illustrates a semiconductor device 100 comprising gate electrode structures 160a and 160b and sigma-shaped cavities 156a, 156b and 156c.

Although this approach may provide cavities in the drain and source areas of transistors with a reduced dependency on pattern loading effects, the shape of the obtained cavities is substantially restricted to U-shaped and sigma-shaped cavities that do not provide the desired flexibility for forming cavities for a strained transistor channel technique based on embedded strain-inducing source and drain semiconductor materials.

In view of the situation described above, the present disclosure relates to manufacturing techniques for forming transistors of enhanced performance on the basis of an incorporated strain-inducing semiconductor material, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing strategies for incorporating a semiconductor material in cavities provided in the drain and source areas of transistors with an increased efficiency. The cavities are formed in active regions of semiconductor devices. An improved shape of the cavities may be achieved by using an amorphization process and a heat treatment so as to selectively modify the etch behavior of exposed portions of the active regions and to adjust the shape of the amorphous regions. The concentration of the resulting lattice defects may correspond to an associated etch rate. The amorphous semiconductor regions may then be etched on the basis of an anisotropic etch process, such as a wet chemical etch process, or an isotropic plasma assisted etch process, wherein the modified material may provide superior uniformity and controllability of the etch process. In this manner, the basic configuration of the cavities may be adjusted with a high degree of flexibility.

One illustrative method disclosed herein comprises forming a gate electrode structure of a transistor above an active region comprising a crystalline semiconductor base material and forming amorphous regions in the active region adjacent to the gate electrode structure. The method further comprises performing a heat treatment so that the amorphous regions are partially re-crystallized and etching the amorphous regions selective to the crystalline semiconductor base material after the heat treatment to form cavities in the active region. Additionally, the method comprises forming a strain-inducing semiconductor material in the cavities to induce strain in the channel region of said transistor.

A further illustrative method disclosed herein relates to forming a transistor. The method comprises performing an ion implantation process so as to form amorphous semiconductor regions laterally adjacent to a gate electrode structure and performing a heat treatment so that the amorphous semiconductor regions are partially re-crystallized. The method further comprises forming cavities in the semiconductor region laterally adjacent to the gate electrode structure by performing an etch process etching amorphous semiconductor material selective to crystalline semiconductor material. Additionally, the method comprises forming a strain-inducing semiconductor material in the cavities and forming drain and source regions in the semiconductor regions.

One illustrative semiconductor device disclosed herein comprises a gate electrode structure formed above an active region. The semiconductor device further comprises a strain-inducing semiconductor material embedded in the active region, the strain-inducing semiconductor material having a substantially uniformly inclined sidewall adjacent to the gate electrode structure, wherein an angle of inclination is in the range of approximately 20-70 degrees.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques for providing cavities in active regions of transistors by applying a process providing a high degree of flexibility in order to determine the size and shape of cavities and, thus, of the resulting embedded semiconductor materials, such as strain-inducing semiconductor materials in the form of silicon/germanium, silicon/carbon and the like. It should be appreciated that, in this context, a strain-inducing semiconductor mixture, such as a silicon/germanium material, may also be referred to as a semiconductor alloy and may represent a substantially crystalline semiconductor material having a different natural lattice constant compared to a silicon material.

The superior degree of flexibility in defining the shape and size of cavities may, in some illustrative embodiments, be accomplished on the basis of an ion implantation process, in which an appropriate implantation species may be incorporated so as to amorphize the material characteristics of the exposed portion of the active region, and of a heat treatment further allowing shaping the amorphous regions by a partial re-crystallization. Consequently, by appropriately shaping the implant profile during the implantation process, the desired size and shape of the cavity to be formed may be predefined, wherein the size and shape may be further adjusted by a moderate heat treatment resulting in a partial re-crystallization, i.e., the heat treatment is performed at a low temperature and/or for a short heating period.

It is well known that a plurality of efficient etch chemistries, such as TMAH and the like, may have a significantly different etch rate in an amorphous semiconductor material, such as a silicon material, compared to the crystalline semiconductor material. Furthermore, TMAH may have a significantly higher etch rate, in a substantially amorphous silicon material compared to a crystalline semiconductor material so that intentionally creating heavy crystal damage may result in an increased removal rate and may, thus, allow efficient control of the subsequent etch process. TMAH may further etch silicon selectively with respect to silicon dioxide, silicon nitride and the like. Similarly, other etch chemicals may respond differently to a modification of the crystalline structure, for instance by providing an increased etch rate for a substantially amorphous material, thereby also enabling a desired adjustment of the size and shape of cavities to be formed in a subsequent etch process. For example, in some illustrative embodiments, the entire etch sequence for providing the cavity on the basis of the amorphous semiconductor material may be accomplished by using wet chemical etch chemistries without requiring any plasma assisted etch processes. In this manner, a very efficient overall process flow may be accomplished.

With reference to the accompanying drawings, further illustrative embodiments will now be described in more detail. For processes not explicitly described with reference to FIGS. 2a-2f may be referred to the corresponding previously described processes.

Figure 2A:
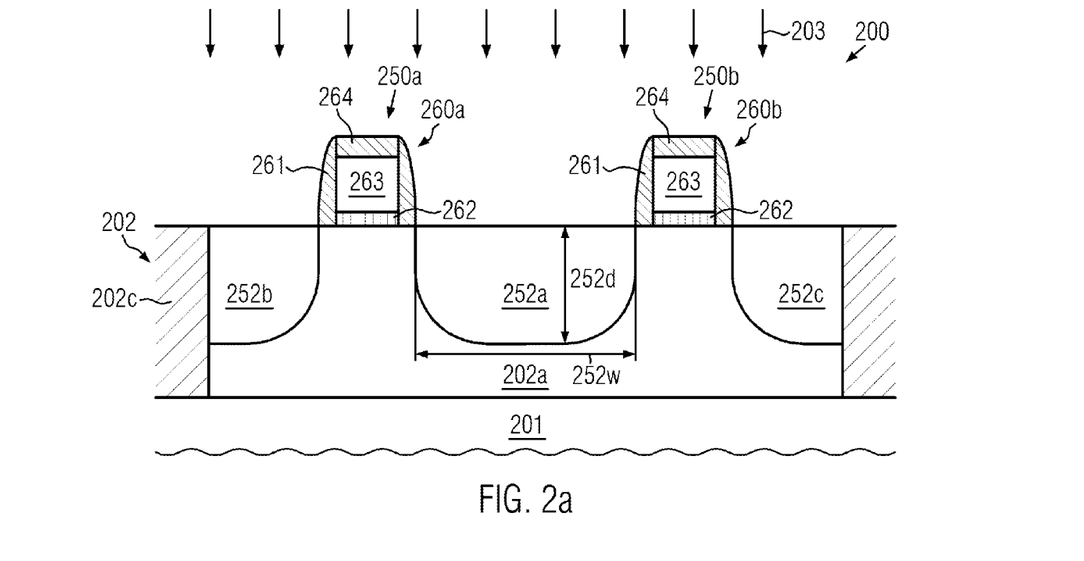
FIG. 2a-2f schematically illustrate cross-sectional views of the semiconductor device during various manufacturing stages in completing a transistor having incorporated a strain-inducing semiconductor material formed on the basis of cavities of superior shape and size, according to illustrative embodiments.

FIG. 2a schematically illustrates a cross-sectional view of a semiconductor device 200 comprising a substrate 201, above which may be provided a semiconductor layer 202, which may be a silicon-based semiconductor material, as the majority of complex integrated circuits are and will be in the foreseeable future produced on the basis of silicon material. It should be appreciated, however, that the principles disclosed herein may also be applied to other semiconductor materials, such as a silicon/germanium material and the like, wherein a corresponding strain-inducing mechanism is to be implemented on the basis of an embedded semiconductor material or when any semiconductor material is to be newly embedded in an active region of a semiconductor device. The semiconductor device material 202 may represent a portion of a crystalline substrate material of the substrate 201, when a bulk configuration is considered. In other cases (not shown), a buried insulating material may be provided below the semiconductor layer 202.

As illustrated, in the manufacturing stage shown, the device 200 may comprise an isolation structure 202c, which may laterally delineate a plurality of active regions or semiconductor regions in the layer 202, wherein, for convenience, a single active region 202a is illustrated in FIG. 2a. It should be appreciated that the term semiconductor layer as used herein for the layer 202 is to be understood as referring to a material layer that may initially be provided in the form of a semiconductor material, which, however, may include other non-semiconductor materials, such as the isolation structures 202c, in an advanced manufacturing stage. The semiconductor region or active region 202a may be understood as an active region in the sense that one or more transistors, such as transistors 250a, 250b, may be formed in and above the semiconductor region 202a. That is, the semiconductor region 202a may have or receive any appropriate basic dopant concentration in order to adjust the basic transistor characteristics, while also PN junctions have to be formed in the active region 202a in a later manufacturing stage so as to complete the transistors 250a, 250b.

In the manufacturing stage shown, gate electrode structures 260a, 260b may be formed on the active region 202a and may have any appropriate configuration with respect to device requirements and the further processing of the device 200. For example, the gate electrode structures 260a, 260b may comprise a gate dielectric material 262, such as a silicon oxide based material, a high-k dielectric material, or any combination thereof may be provided, in combination with an appropriate electrode material 263, such as a silicon material and/or a metal-containing electrode material and the like, may be provided with an appropriate gate length, i.e., in FIG. 2a, the horizontal extension, which may be 40 nm and less in sophisticated applications. Furthermore, a sidewall spacer structure 261, which may for instance comprise a liner (not shown) and a spacer element may be provided on sidewalls so as to preserve integrity of the materials 262, 263. Furthermore, a dielectric cap material or materials 264 may be provided, which may act as an etch and deposition mask during the further processing. The spacer structure 261 may be provided in the form of a silicon nitride material, a silicon dioxide material and the like. Similarly, the dielectric cap layer 264 may be provided in the form of any appropriate dielectric material.

The device 200 may comprise amorphous regions 252a, 252b, 252c provided at a source side and a drain side of the transistors 250a, 250b, respectively. In some illustrative embodiments, the amorphous regions 252a, 252b, 252c may have a significantly increased amount of lattice defects relative to the remaining active region 202a. That is, the average concentration of lattice defects in the regions 252a, 252b, 252c may at least be five orders of magnitudes greater than in the remaining active region 202a. For example, in addition to the increased amount of lattice defects, the regions 252a, 252b, 252c may also have incorporated therein an increased amount of a specific implantation species, such as germanium, xenon and the like, which may be used for generating the desired amorphous state of the regions 252a, 252b, 252c. The size and shape of the regions 252a, 252b, 252c may, thus, be "defined" by implantation specific "boundaries," which may have a certain degree of variability due to the nature of an implantation process. In this application, a portion of the active region 202a may be considered as being outside of the regions 252a, 252b, 252c when an average concentration of lattice defects in an appropriately selected unit volume has a value that is less than two orders of magnitude of a maximum concentration of lattice defects. That is, if a maximum concentration of lattice defects is determined somewhere within the regions 252a, 252b, 252c, any area of the active region 202a is considered as being outside of the regions 252a, 252b, 252c whenever an average concentration is encountered that is at least two orders of magnitude lower than the maximum concentration.

The semiconductor device 200 as shown in FIG. 2a may be formed on the basis of the following process techniques. The isolation structures 202c may be provided in the semiconductor layer 202 on the basis of any appropriate manufacturing strategy, i.e., by providing an appropriate hard mask on the basis of sophisticated lithography techniques and patterning the semiconductor layer 202 so as to form trenches, which may subsequently be filled with any appropriate dielectric material. After the removal of any excess material and of any hard mask materials, the further processing may be continued by providing appropriate materials for the gate electrode structure 260a, 260b and patterning the resulting layer stack by using sophisticated lithography and patterning techniques. In this way, the gate dielectric material 262, the electrode material 263 and the cap material 264 may be provided with a desired gate length and subsequently the spacer structure 261 may be formed, for instance, by well-controllable deposition and etch techniques in order to obtain the desired confinement of the sensitive materials 262, 263 and also provide desired lateral offset for the further processing for incorporating a semiconductor material in the region 202a. To this end, well-established low pressure chemical vapor deposition (CVD), multi-layer deposition techniques and the like may be applied. It should be appreciated that other transistors and gate electrode structures may be covered by a mask layer, such as the material layers used for forming the spacer structure 261 and the like.

Thereafter, the amorphous regions 252a, 252b, 252c may be formed on the basis of an ion bombardment or implantation process 203, in which an appropriate implantation species, such as xenon, germanium, silicon and the like, may be used in order to provide the desired amorphization. For example, as previously discussed, the amorphization may be seen in the provision of a significant amount of lattice defects, thereby converting substantially crystalline material of the region 202a locally into an amorphous portion, thereby endowing the regions 252a, 252b, 252c with significantly different etch rates with respect to a plurality of well-established etch strategies compared to the remaining portion of the active region 202a. To this end, process parameters of the ion implantation process 203 may be selected for a given implantation species so as to appropriately define the average penetration depth and the concentration maximum of implantation species at a specific depth within the active region 202a. For example, heavy ions, such as xenon, germanium and the like, may generate pronounced lattice damage for moderately low implantation dose values of, for instance, $10^{14}$-$10^{15}$ per $cm^2$.

In one embodiment, germanium is implanted at an energy of approximately 30 keV and a dose of approximately $3\times10^{14}$ atoms per $cm^2$ by a non-tilted implantation. The depth 252d of the obtained amorphous region 252a is approximately 42 nm, wherein the amorphous region 252a comprises rounded corners. The lateral width 252w of the amorphous region 252a is approximately 50 nm at the top of the amorphous region. Further appropriate process parameters may be established on the basis of simulation, experiments and the like in order to, for instance, adjust the depth of the regions 252a, 252b, 252c.

Figure 2B:
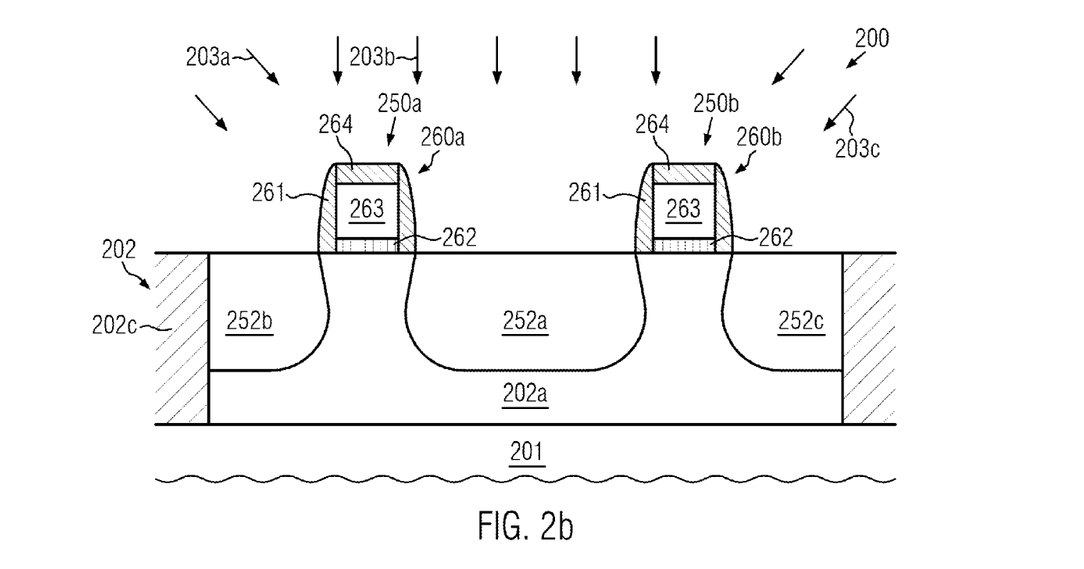

FIG. 2b schematically illustrates the semiconductor device 200 during an implantation process or sequence of processes in order to further adjust the size and shape of the amorphous portions 252a, 252b, 252c within the active region 202a. As illustrated, in addition to or alternatively to the implantation process 203 as shown in FIG. 2a, an implantation process 203a may be applied, wherein the incoming ion beams may be tilted with respect to a surface normal, thereby providing an increased penetration depth in a lateral direction at the source side or the drain side, as indicated by the amorphized regions 252a, 252b. That is, the regions 252a, 252b may extend below the spacer structures 261, wherein a corresponding degree of overlap may be determined on the basis of implantation energy and tilt angle of the tilted implantation step 203a. On the other hand, the gate electrode structures 260a, 260b may efficiently block the incorporation of the implantation species during the process 203a at the opposite source or drain side. Furthermore, additionally or alternatively, an implantation process 203b with a substantially zero tilt angle, for instance as also described above with reference to the implantation process 203 in FIG. 2a, may be performed. Similarly, a tilted implantation process 203c may be applied, thereby forming the modified regions 252b, 252c, which may have a desired overlap with the gate electrode structure 260a, 260b. When combining at least the tilted implantation steps 203a, 203c, an increased degree of overlapping may be obtained, wherein the resulting configuration may be symmetric, when the same process parameters may be used during the implantation processes 203a, 203c, except for the sign of the tilt angle, wherein the tilt angle determines the angle of inclination of the interface between the amorphous and the crystalline regions of the active regions. It should be appreciated that also a different depth of the amorphous regions may be accomplished, at least in the vicinity of the gate electrode structure, by using different magnitudes for the tilt angle and/or a different implantation energy. Consequently, by applying an appropriate implantation sequence and corresponding process parameters, the size and shape of the amorphous regions 252a, 252b, 252c may be adjusted.

Figure 2C:
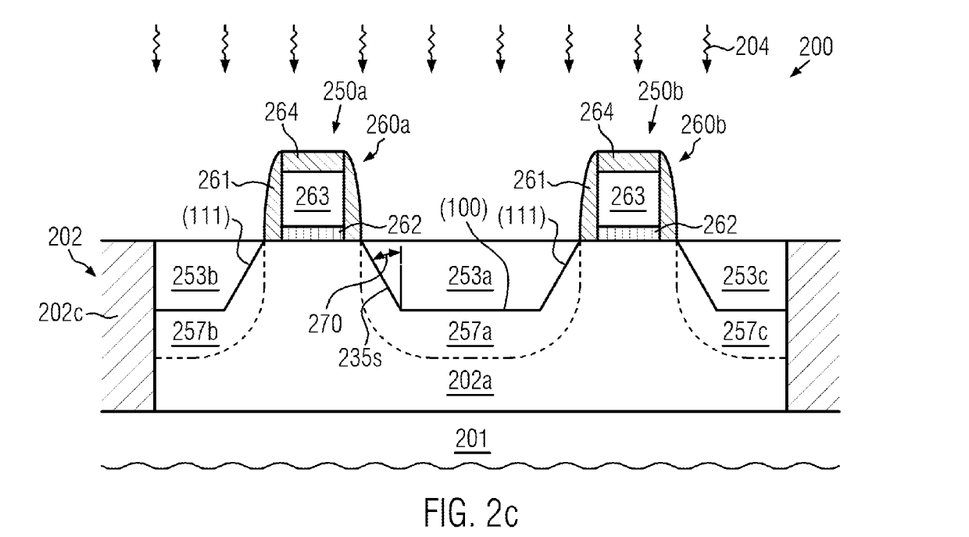

FIG. 2c schematically illustrates the semiconductor device 200 in a further advanced manufacturing stage. As illustrated, a heat treatment 204 is performed to re-crystallize the amorphous regions 252a, 252b, 252c (FIGS. 2a and 2b) partially and to form reshaped amorphous regions 253a, 253b, 253c. Any appropriate heat treatment, such as a furnace heat process or a rapid thermal annealing (RTA), may be employed. The temperature may approximately range from 350-1000° C. and the duration of the heating period may range from approximately 1 second to 5 hours, wherein high temperatures require short heating periods. In one embodiment, the heat treatment is performed at a temperature in the range of approximately 350-500° C. for a heating period of approximately 1-5 hours. More typical, the heat treatment is performed at a temperature in the range of approximately 400-450° C. for approximately 1-3 hours. In a further embodiment, the heat treatment is performed at a temperature in the range of approximately 500-700° C. for a heating period of approximately 1-15 minutes. More typical, the heat treatment is performed at a temperature in the range of approximately 550-650° C. for approximately 1-10 minutes. In a further embodiment, using an RTA process, the heat treatment is performed at a temperature in the range of approximately 800-1000° C. for a heating period of approximately 1-15 seconds. More typical for an RTA process, the heat treatment is performed at a temperature in the range of approximately 850-950° C. for approximately 1-10 seconds. In the heat treatment, the amorphous regions 252a, 252b, 252c (FIG. 2a) are partially re-crystallized. The re-crystallization advances from the crystalline interface of the amorphous regions and the crystalline regions of the active area preferably along the crystal planes so that the finally achieved shape of the modified amorphous regions 253a, 253b, 253c is determined by the temperature and duration of the heat treatment and by the orientation of the involved silicon crystal planes. In one illustrative embodiment, an angle of inclination 270 of the sidewalls 253s of the modified amorphous regions 253a, 253b, 253c may be in the range of approximately 20-70 degrees. In further illustrative embodiments, an angle of inclination 270 may be in the range of approximately 30-60 degrees or more typically in the range of approximately 40-50 degrees.

For the amorphous regions formed in the active region 202a oriented substantially in the standard crystallographic orientation, wherein a <100> orientation may be perpendicular to horizontal surface areas of the active region 202a and the transistor length direction is oriented in the <110> direction or any equivalent direction, the resulting modified amorphous regions 253a, 253b, 253c may be represented by a (100) crystal plane at a button surface and a (111) crystal plane on the inclined sidewalls 253s. Thus, the moderate heat treatment provides a further approach for defining the shape of cavities. Thus, the degree of flexibility with regard to possible cavity shapes is increased.

In the heat treatment 204, in the example described in FIG. 2a, the depth of the amorphous region is reduced from approximately 42 nm to approximately 10 nm, wherein the maximum lateral dimension of the amorphous region is substantially maintained so that the width of the modified amorphous region 253a is approximately 50 nm at the top of the amorphous region, whereas the width of the amorphous region at the bottom is reduced to approximately 30 nm.

A plurality of etch chemistries may be sensitive to certain implantation species, such as dopants in the form of N-type dopant species, xenon and the like, thereby enabling a significant reduction of etch rate, for instance, when re-establishing a substantially crystalline state. Thus, in illustrative embodiments, the amorphization process 203 (FIG. 2a) may be performed on the bases of xenon in order to provide superior control of a subsequent etch process due to the incorporation of xenon into the re-crystallized regions 257a, 257b, 257c.

Figure 2D:
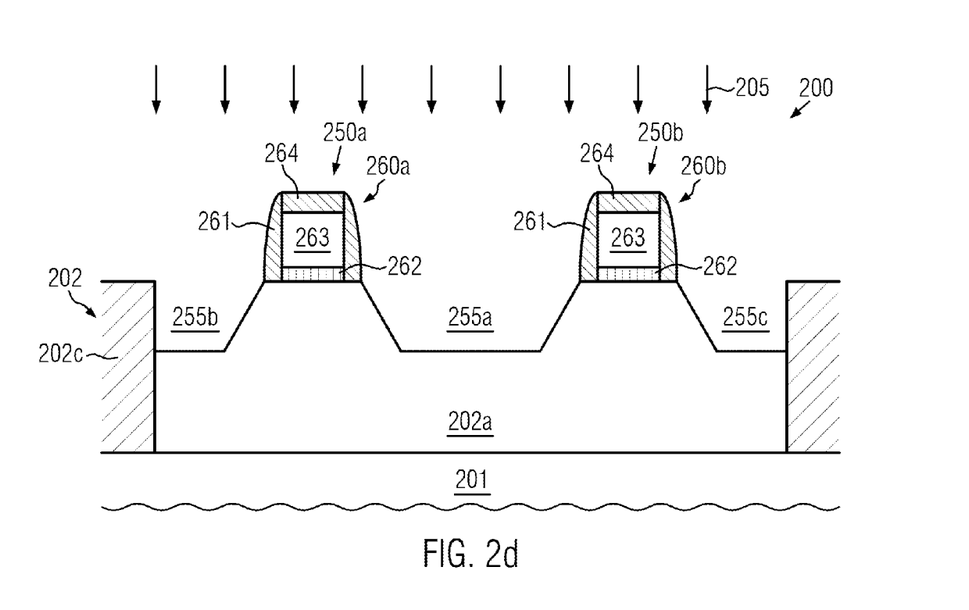

FIG. 2d schematically illustrates the semiconductor device 200 in a further advanced manufacturing stage. As illustrated, an etch process 205 may be performed so as to remove the amorphous portions 253a, 253b, 253c of the active region 202a so as to provide cavities 255a, 255b, 255c laterally adjacent to the gate electrode structures 260a, 260b, wherein a certain degree of "overlap" may be adjusted on the basis of the previously performed implantation sequence 203a, 203b (FIG. 2b) and heat treatment 204 (FIG. 2c). The etch process 205 may, in some illustrative embodiments, be performed on the basis of a wet chemical etch recipe, for instance using TMAH, potassium hydroxide and the like, wherein, in this case, the corresponding etch chemistries may have a substantially isotropic etch behavior within the amorphous regions 253a, 253b, 253c (FIG. 2a), since the crystal structure is substantially destroyed in these areas. Furthermore, due to the amorphous state, the etch rate may be substantially higher compared to the crystalline portion of the active region 202a, so that the amorphous material may be efficiently removed, wherein the corresponding etch rate may significantly drop when the concentration of lattice effects drops, thereby providing a self-controlling etch behavior.

As previously discussed with reference to FIG. 2b, also a difference in depth of the cavities 255a, 255b, 255c may be accomplished during the etch process 205, while nevertheless providing a high degree of uniformity. Similarly, a desired degree of overlapping or isometric configuration may be obtained during the etch process 205 due to the predefined amorphous regions 252a, 252b, 252c (FIGS. 2a and 2b). Consequently, a high degree of uniformity, for instance, for a depth of the cavities 255a, 255b, 255c may be accomplished.

It should be appreciated that the etch process 205 may be performed on the basis of a crystallographically anisotropic wet chemical etch, while, in other cases, isotropic plasma assisted etch recipes may be used. Due to the previous amorphization, at any rate, a substantially direction-independent etch behavior may be obtained during the removal of the amorphous material portion.

Figure 2E:
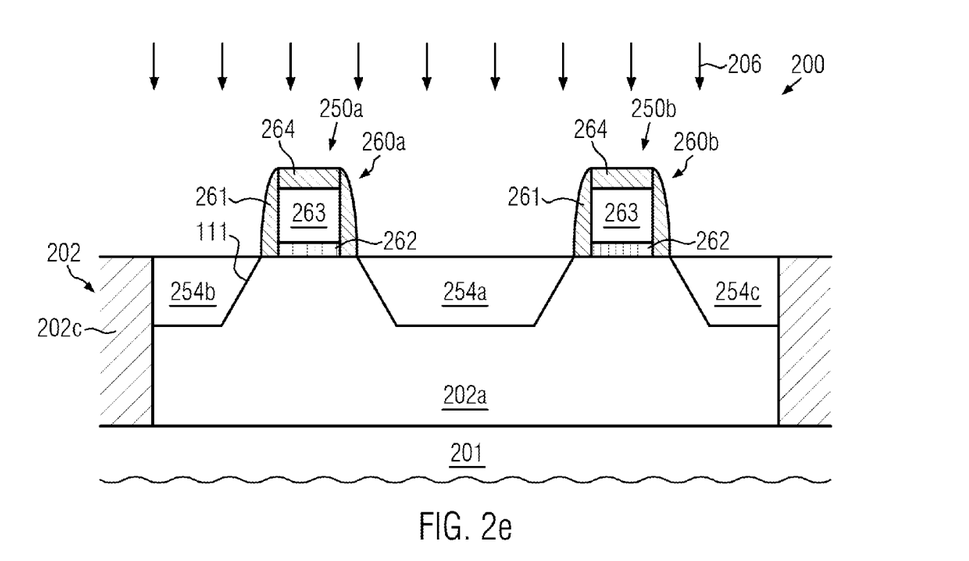

FIG. 2e schematically illustrates the semiconductor device 200 in a further advanced manufacturing stage, in which a selective epitaxial growth process 206 may be applied in order to form a strain-inducing semiconductor material 254a, 254b, 254c in the previously provided cavities having the superior uniformity with respect to size and shape. To this end, any appropriate and well-established deposition recipe may be applied, wherein the spacer structure 261 and the dielectric cap layer 264 may act as a deposition mask. In illustrative embodiments, the strain-inducing semiconductor material 254a, 254b, 254c, e.g., a silicon/germanium material may be in situ doped during the growth process 206, e.g., by incorporating boron to form deep source and drain regions of the transistors 250a, 250b, e.g., of a P-channel transistor. Due to the improved shape, the relevant upper portion of the strain-inducing semiconductor material 254a, 254b, 254c is arranged closer to the channel region of the transistors 250a, 250b so that the efficiency of the stress transfer is improved compared to conventional techniques.

Figure 2F:
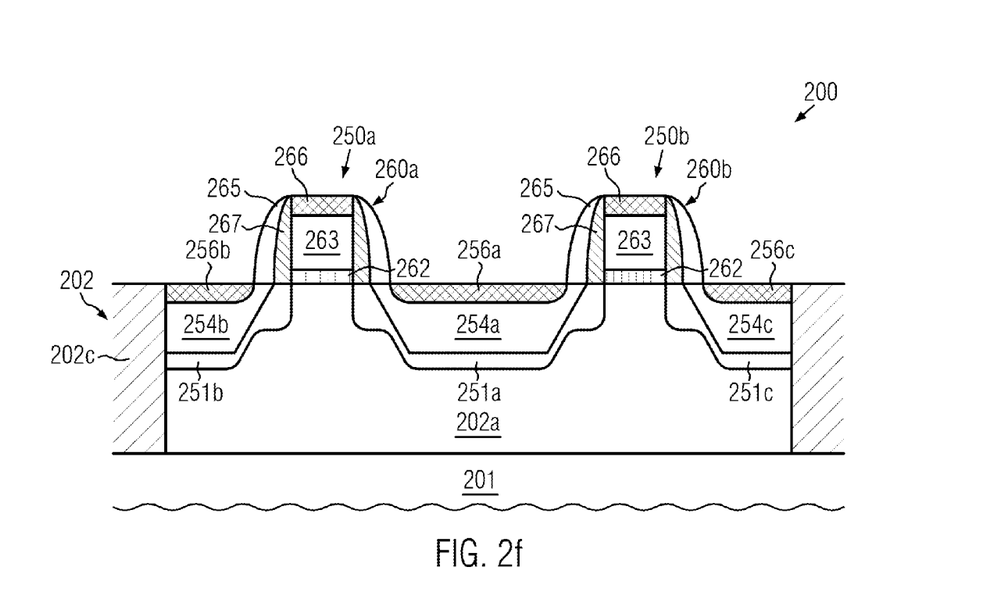

FIG. 2f schematically illustrates the semiconductor device 200 in a further advanced manufacturing stage. As illustrated, the transistors 250a, 250b may comprise drain and source regions 251a, 251b, 251c, respectively, which may, according to an illustrative embodiment, at least be partially formed in the previously formed strain-inducing semiconductor material 254a, 254b, 254c by a corresponding source and drain implantation process (not shown). Furthermore, an appropriate sidewall spacer structure 265, 267 may be provided for the gate electrode structures 260a, 260b, which may be used for appropriately adjusting the vertical and lateral dopant profiles of the drain and source regions 251a, 251b, 251c and/or of the metal silicide regions 256a, 256b, 256c. Furthermore, metal silicide material 266 may be formed in the gate electrode structures 260a, 260b, thereby also providing superior conductivity of the gate electrode structures. In illustrative embodiments, the gate electrode structure 260a, 260b may comprise a high-k dielectric material 262, a metal-containing electrode material formed above the high-k dielectric material, a silicon-containing semiconductor material 263 and a metal silicide 266.

The transistors 250a, 250b, as shown in FIG. 2f, may be formed on the basis of any appropriate process strategy. That is, after forming the semiconductor material 254a, 254b, 254c, for instance in the form of silicon/germanium, silicon/carbon and the like, the spacer structure 261 or a portion thereof and the cap layer 264 (FIG. 2e) may be removed and the drain and source regions 251a, 251b, 251c may be formed, possibly in combination with the spacer structure 265, 267, in accordance with well-established process strategies. Thereafter, the final dopant profile of the drain and source regions 251a, 251b, 251c may be adjusted on the basis of anneal processes. Thus, appropriate strain conditions may be achieved in the channel region of the transistors 250a, 250b with a high degree of flexibility and of uniformity across the entire device 200, wherein the materials 254a, 254b, 254c may be provided with any appropriate configuration, for instance with respect to depth, isometrics, overlap with the gate electrode structures 260a, 260b, and the like. Hence, a high degree of flexibility in adjusting the performance of the transistors 250a, 250b may be obtained, while at the same time a desired process uniformity is achieved. After any anneal processes, the metal silicide materials 256a, 256b, 256c, 266 are formed, for instance, by using well-established process strategies for depositing one or more desired refractory metals, such as nickel, platinum and the like, and initiating a chemical reaction.

With reference to FIGS. 3a-3f, further illustrative embodiments will be described in more detail in which cavities are formed on the basis of offset spacers that are appropriate for defining source/drain extension regions. The processes not explicitly described with reference to FIGS. 3a-3f may be performed as described with reference to FIGS. 2a-2f.

Figure 3A:
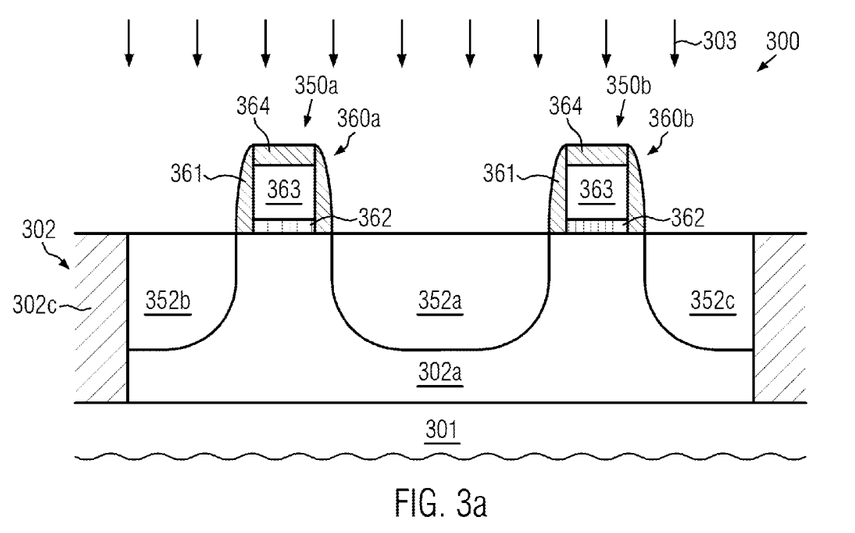
FIGS. 3a-3f schematically illustrate cross-sectional views of the semiconductor device during various manufacturing stages of further illustrative embodiments.

FIG. 3a schematically illustrates a cross-sectional view of the semiconductor device 300 comprising amorphous regions 352a, 352b, 352c which are formed on the basis of offset spacers 361 that are also appropriate to define source/drain extension regions of the transistors 350a, 350b. The amorphization process may be performed as described with reference to FIG. 2a.

Figure 3B:
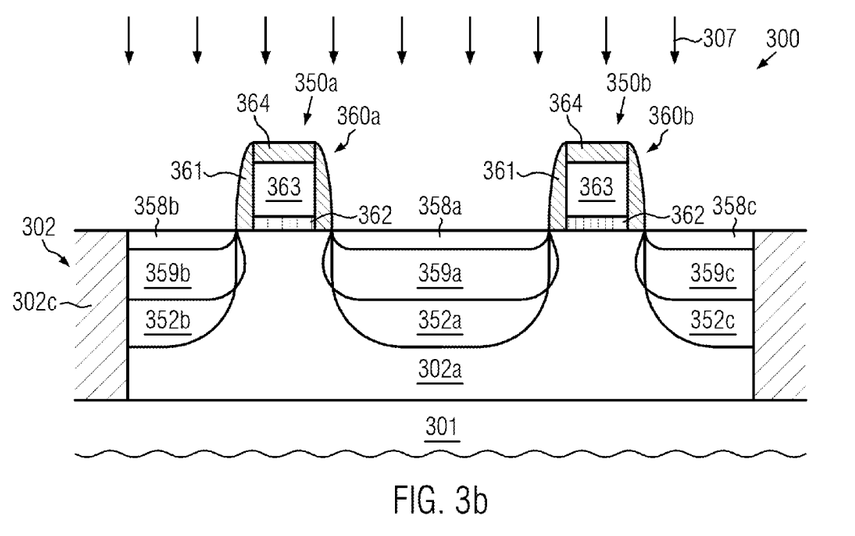

FIG. 3b schematically illustrates the device 300 according to a further advanced manufacturing stage in which a source and drain extension implantation process 307 is performed to form source/drain extension regions 358a, 358b, 358c in the pre-amorphized regions 352a, 352b, 352c so that the implantation depth is well defined as, due to the amorphous stage of the regions 352a, 352b, 352c, the undesired channeling effect is avoided or at least reduced. In this manufacturing stage, also halo regions 359a, 359b, 359c may be implanted, typically by a tilted implant process to adjust the threshold voltage of the transistors 350a, 350b, appropriately.

Figure 3C:
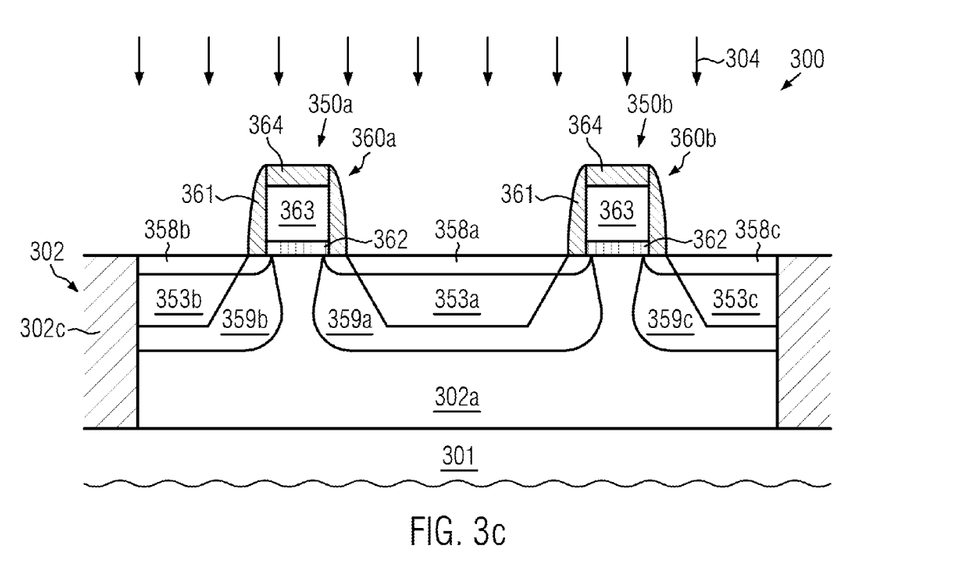

FIG. 3c schematically illustrates the device 300 according to a further advanced manufacturing stage in which a heat treatment 304 is performed to partially re-crystallize the amorphous regions 352a, 352b, 352c (FIG. 3b) so that re-crystallized regions (not shown) and remaining amorphous regions 353a, 353b, 353c are formed as previously described with reference to FIG. 2c. In addition, the heat treatment 304 may also lead to a diffusion of the implanted source and drain extension species and of the implanted halo species.

Figure 3D:
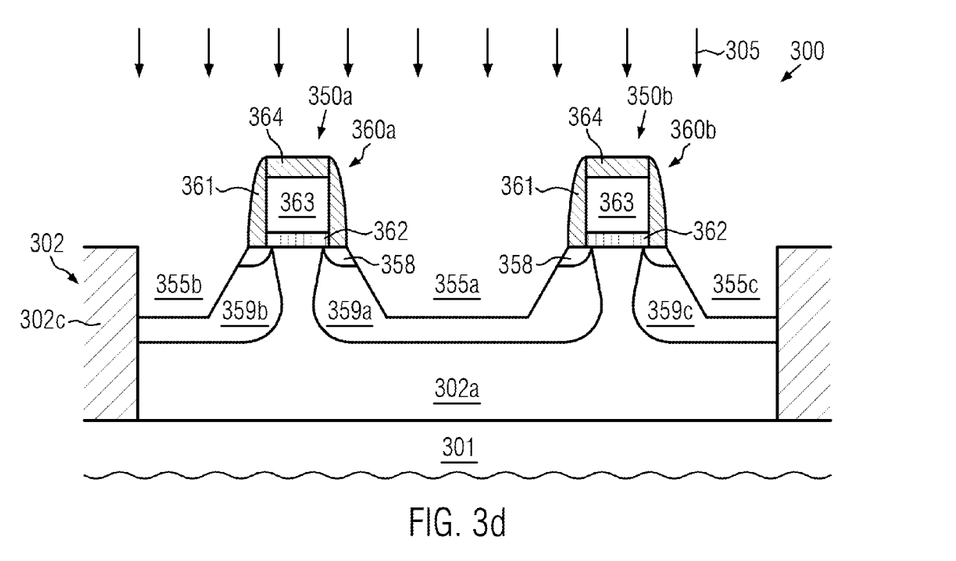

FIG. 3d schematically illustrates the device 300 according to a further advanced manufacturing stage in which, as previously described with reference to FIG. 2d, the remaining amorphous regions 353a, 353b, 353c are removed by an etch process 305. As the implanted source and drain extension species are previously partially diffused into the crystalline semiconductor regions, source and drain extension regions are maintained below the gate electrode structures 360a, 360b. In case the heat treatment 304 (FIG. 3c) was not sufficient to activate the source/drain extension dopants, an additional annealing step (not shown) may be performed to activate the dopants without further re-crystallization as the amorphous regions are already removed in this stage.

Figure 3E:
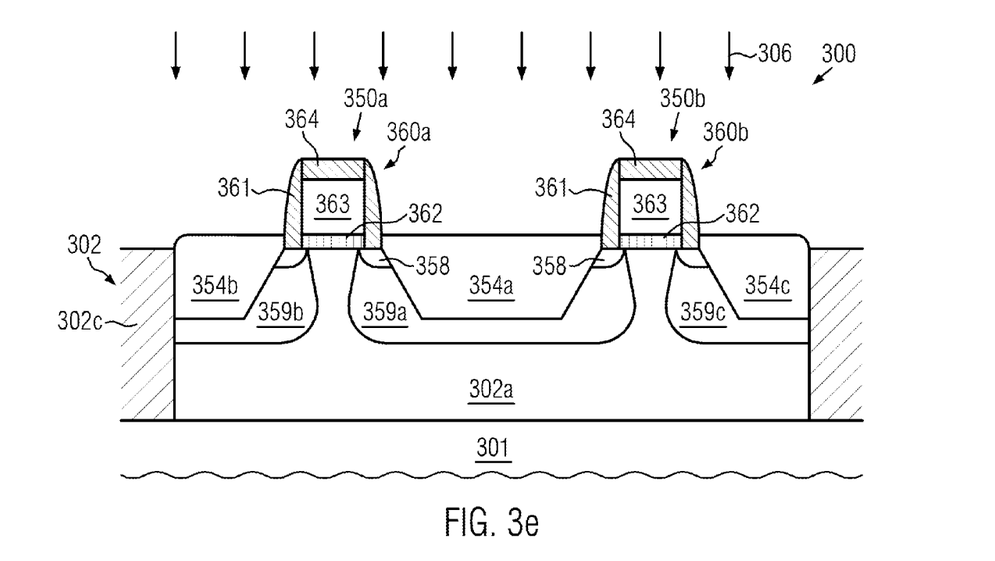

FIG. 3e schematically illustrates the device 300 according to a further advanced manufacturing stage in which strain-inducing semiconductor material 354a, 354b, 354c is selectively grown in the cavities 355a, 355b, 355c (FIG. 3d) similar to the corresponding process described with reference to FIG. 2e. As it is not necessary to remove the spacers 361, the grown semiconductor material may form raised source and drain regions to improve the conductivity of the transistors 350a, 350b and to facilitate the subsequently performed source and drain contact process.

In one illustrative embodiment, the strain-inducing silicon material 354a, 354b, 354c is in situ doped to form, in combination with the previously implanted source and drain extension regions 358, deep source and drain regions 359a, 359b, 359c of the transistors 350a, 350b. Due to in situ doping, a further deep source/drain implantation step may be avoided, so that the strain-inducing effect is not adversely affected, as a relaxation effect typically caused by an implantation process is avoided.

Figure 3F:
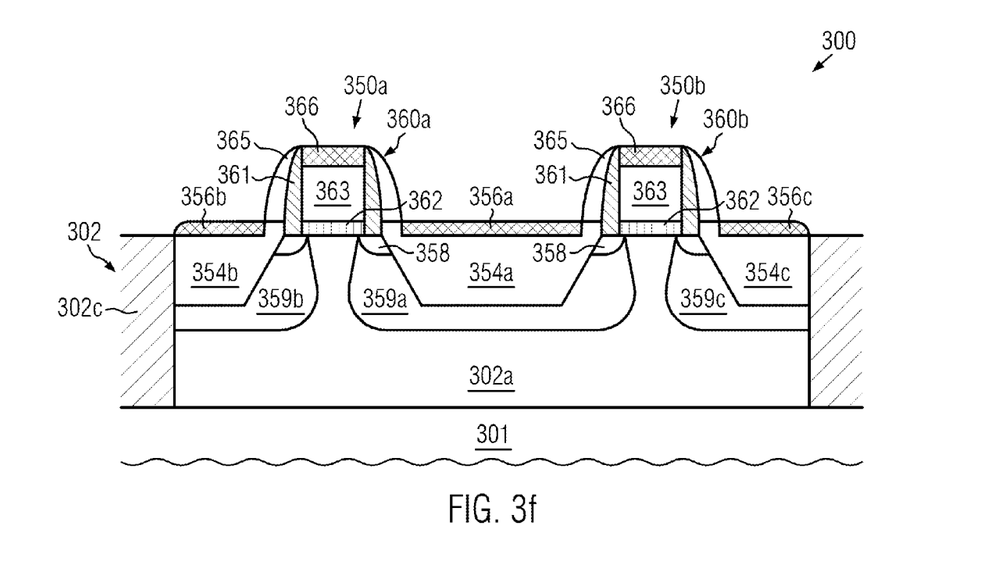

FIG. 3f schematically illustrates the device 300 according to a further advanced manufacturing stage in which silicide regions 356a, 356b, 356c, 366 may be formed on the embedded source and drain silicon material 354a, 354b, 354c and on the gate electrode structures 360a, 360b, respectively, as previously described with reference to FIG. 2f. Contrary to the embodiments described with reference to FIG. 2f, the spacers 361 may be maintained as the source and drain extension implantation has been performed in advance. In illustrative embodiments, spacers 365 may be formed on spacers 361 to define deep source and drain regions and/or the silicide regions 356a, 356b, 356c.

As a result, the present disclosure provides manufacturing techniques in which superior performance of transistor elements may be accomplished, when a strain-inducing semiconductor material is to be incorporated into the drain and source areas of the transistors. To this end, the basic size and shape of the cavities may be defined by an ion implantation process and a heat treatment, which may result in an appropriate amorphization and shaping of a portion of the active region, thereby providing superior flexibility of the cavity shaping process and a desired etch controllability and uniformity during the subsequent actual formation of the cavities. For example, a desired size and shape may be obtained on the basis of wet chemical etch chemistries, even if these chemistries have basically a crystallographically anisotropic etch behavior.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate electrode structure of a transistor above an active region comprising a crystalline semiconductor base material;
    forming amorphous regions in said active region adjacent to said gate electrode structure;
    performing a heat treatment so that said amorphous regions are partially re-crystallized;
    etching the partially re-crystallized amorphous regions selective to the crystalline semiconductor base material after said heat treatment to form cavities in said active region; and
    forming a strain-inducing semiconductor material in said cavities to induce strain in the channel region of said transistor.

2. The method of claim 1, wherein said heat treatment is performed at a temperature in the range of approximately 400-450° C. for approximately 1-3 hours.

3. The method of claim 1, wherein said heat treatment is performed at a temperature in the range of approximately 550-650° C. for approximately 1-10 minutes.

4. The method of claim 1, wherein said heat treatment is performed at a temperature in the range of approximately 850-950° C. for approximately 1-10 seconds.

5. The method of claim 1, wherein said amorphous regions are formed by a pre-amorphization implantation process.

6. The method of claim 5, wherein an implant species in said pre-amorphization implantation process comprises at least one of germanium and xenon.

7. The method of claim 5, wherein said pre-amorphization implantation process comprises using a tilt angle.

8. The method of claim 1, wherein said heat treatment is performed after a source and a drain extension implantation.

9. The method of claim 8, further comprising performing an annealing process after etching the amorphous regions to activate a dopant species implanted in said source and drain extension implantation.

10. The method of claim 1, wherein said strain-inducing semiconductor material comprises in situ doped silicon/germanium.

11. A method of forming a transistor, the method comprising:
    performing an ion implantation process so as to form amorphous semiconductor regions laterally adjacent to a gate electrode structure;
    performing a heat treatment so that said amorphous semiconductor regions are partially re-crystallized;
    forming cavities in said semiconductor region laterally adjacent to said gate electrode structure by performing an etch process etching the partially re-crystallized amorphous semiconductor material of the amorphous semiconductor material selective to crystalline semiconductor material;
    forming a strain-inducing semiconductor material in said cavities; and
    forming drain and source regions in said semiconductor regions.

12. The method of claim 11, wherein performing an etch process comprises selectively removing amorphous portions by using an isotropic etch recipe.

13. The method of claim 11, wherein performing said ion implantation process comprises using a tilt angle.

14. The method of claim 11, wherein said heat treatment is performed after a source and a drain extension implantation.

* * * * *